United States Patent
Kojo

(10) Patent No.: US 12,107,543 B2
(45) Date of Patent: Oct. 1, 2024

(54) OVEN-CONTROLLED CRYSTAL OSCILLATOR

(71) Applicant: DAISHINKU CORPORATION, Kakogawa (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

(21) Appl. No.: 17/768,232

(22) PCT Filed: Jul. 30, 2021

(86) PCT No.: PCT/JP2021/028258
§ 371 (c)(1),
(2) Date: Apr. 12, 2022

(87) PCT Pub. No.: WO2022/025227
PCT Pub. Date: Feb. 3, 2022

(65) Prior Publication Data
US 2024/0120880 A1    Apr. 11, 2024

(30) Foreign Application Priority Data
Jul. 31, 2020   (JP) .................. 2020-130421

(51) Int. Cl.
*H03B 5/04* (2006.01)
*H03B 5/32* (2006.01)
*H03L 1/02* (2006.01)
*H03L 1/04* (2006.01)

(52) U.S. Cl.
CPC ............... *H03B 5/04* (2013.01); *H03B 5/32* (2013.01); *H03L 1/028* (2013.01); *H03L 1/04* (2013.01)

(58) Field of Classification Search
CPC .. H03B 5/04; H03B 5/32; H03L 1/028; H03L 1/04
USPC ................... 331/158, 176, 116 FE, 108 C
See application file for complete search history.

(56) References Cited

U.S. PATENT DOCUMENTS

| 7,812,683 | B2* | 10/2010 | Sutardja | ............... G11C 5/143 |
| | | | | 257/528 |
| 2016/0204759 | A1* | 7/2016 | Kikushima | ......... H03H 9/1021 |
| | | | | 310/343 |
| 2016/0322952 | A1 | 11/2016 | Iizuka et al. | |
| 2017/0019109 | A1 | 1/2017 | Arai | |

FOREIGN PATENT DOCUMENTS

| CN | 106105025 A | 11/2016 |
| JP | 6376681 B2 | 8/2018 |
| TW | 201541861 A | 11/2015 |

* cited by examiner

*Primary Examiner* — Arnold M Kinkead
(74) *Attorney, Agent, or Firm* — METROLEX IP LAW GROUP, PLLC

(57) ABSTRACT

An oven-controlled crystal oscillator according to one or more embodiments may include a core section hermetically encapsulated in a package for thermal insulation, wherein the core section is supported by the package via a core substrate, and the core section has a layered structure in which at least an oscillation IC, a crystal resonator and a heater IC are laminated in sequence.

9 Claims, 13 Drawing Sheets

OVEN-CONTROLLED CRYSTAL OSCILLATOR

TECHNICAL FIELD

The present invention relates to an oven-controlled crystal oscillator.

BACKGROUND ART

In a piezoelectric resonator such as a crystal resonator, the vibration frequency changes depending on the temperature according to its frequency temperature characteristics. In order to keep the temperature around the piezoelectric resonator constant, an oven-controlled crystal (Xtal) oscillator (hereinafter also referred to as an "OCXO") is known. It has a configuration in which a piezoelectric resonator is encapsulated in a thermostatic oven (for example, see Patent Document 1).

PRIOR ART DOCUMENT

Patent Document

[Patent Document 1] JP 6376681

SUMMARY OF THE INVENTION

Problem to be Solved by the Invention

In the above-described OCXO, when a piezoelectric resonator, an oscillation IC, a heater IC and the like are disposed separated from each other, there may occur difference in the temperature among the piezoelectric resonator, the oscillation IC, the heater IC and the like, which also may deteriorate accuracy in the temperature adjustment by the OCXO. As a result, the oscillation frequency of the OCXO may be unstable.

The present invention was made in consideration of the above circumstances, an object of which is to provide an oven-controlled crystal oscillator capable of stabilizing oscillation frequency by disposing a piezoelectric resonator, an oscillation IC and a heater IC close to each other as much as possible.

Means for Solving the Problem

In order to achieve the above object, an oven-controlled crystal oscillator of the present invention includes a core section hermetically encapsulated in a package for thermal insulation. The core section is supported by the package via a core substrate. Also, the core section has a layered structure in which at least an oscillation IC, a piezoelectric resonator and a heater IC are laminated in sequence.

With the above-described configuration, since the core section has a layered structure made of the oscillation IC, the piezoelectric resonator and the heater IC, the temperature of the core section is controlled in a state in which the oscillation IC and the piezoelectric resonator are located close to each other. Therefore, it is possible to reduce the difference in the temperature between the oscillation IC and the piezoelectric resonator, which leads to the temperature adjustment with high accuracy by an OCXO. Also, since the piezoelectric resonator is interposed between the oscillation IC and the heater IC, the oscillation IC is separated from the heater IC. Thus, it is possible to reduce oscillation frequency noise of the piezoelectric resonator. Furthermore, since the core section is fixed to the package via the core substrate, stress from a mounting board on which the OCXO is mounted is hardly transferred to the core section. Thus, it is possible to protect the core section.

In the above-described configuration, it is preferable that a thermal conductivity enhancer fixes at least one pair of facing surfaces to each other out of the following pairs: respective facing surfaces of the oscillation IC and the piezoelectric resonator; respective facing surfaces of the piezoelectric resonator and the heater IC; and respective facing surfaces of the heater IC and the core substrate.

With the above-described configuration, every pair of facing surfaces among the respective components of the core section (the oscillation IC, the crystal resonator and the heater IC) and the core substrate is connected to each other via the thermal conductivity enhancer. Thus, heat transfer easily occurs between the elements (i.e. the components of the core section and the core substrate), which makes the core section rapidly a thermal equilibrium state. Therefore, it is possible to adjust the temperature by the OCXO with high accuracy.

In the above-described configuration, it is preferable that the oscillation IC, the piezoelectric resonator and the heater IC respectively have areas, in plan view, that become gradually smaller from the downside to the upside. Also it is preferable that, out of the oscillation IC and the piezoelectric resonator, a whole facing surface of one of them, which has a smaller area, faces a facing surface of the other of them. And it is preferable that, out of the piezoelectric resonator and the heater IC, a whole facing surface of one of them, which has a smaller area, faces a facing surface of the other of them.

With the above-described configuration, out of the components of the core section, the whole bonding surface of the component having a smaller area in plan view faces the bonded surface of the component having a larger area. Thus, it is possible to homogenize the temperature of the core section.

In the above-described configuration, it is preferable that all of the rear surface of the core section is bonded to the core substrate.

With the above-described configuration, since all the rear surface of the core section is bonded to the core substrate, it is possible to homogenize the temperature of the whole of core substrate and core section bonded thereto.

In the above-described configuration, it is preferable that the core substrate is bonded to the package so as to have a space between the core substrate and an inner bottom surface of the package.

With the above-described configuration, it is possible to improve thermal insulation effectiveness by the space between the core substrate and the inner bottom surface of the package.

In the above-described configuration, it is preferable that a pair of step parts facing each other is formed inside the package, and that the core substrate is disposed so as to be bridged between the pair of step parts.

With the above-described configuration in which the step parts are provided in the package, it is possible to easily fix the core section inside the package. Also, since the space is formed under the core substrate, it is possible to improve thermal insulation effectiveness.

In the above-described configuration, it is preferable that an interposed substance is disposed between the core substrate and the inner bottom surface of the package.

With the above-described configuration, it is possible to easily ensure the space between the core substrate and the inner bottom surface of the package by disposing the interposed substance.

In the above-described configuration, it is preferable that the piezoelectric resonator includes: a first sealing member and a second sealing member both made of glass or crystal; and a piezoelectric resonator plate made of crystal, and further that the piezoelectric resonator plate has a vibrating part, on respective main surfaces of which excitation electrodes are formed. Furthermore, it is preferable that the first sealing member and the second sealing member are laminated and bonded to each other via the piezoelectric resonator plate so as to hermetically seal the vibrating part of the piezoelectric resonator plate in an internal space.

With the above-described configuration, the piezoelectric resonator having the sandwich structure is used as the piezoelectric resonator of the core section, which hermetically seals the vibrating part as described above in the inside. Thus, it is possible to reduce the height and the size of the core section, and the heat capacity of the core section can be reduced. Therefore, it is possible to reduce the heater calorific value of the OCXO, which leads to low power consumption. Furthermore, the temperature followability of the core section can be improved, which also improves the stability of the OCXO. In addition, in the piezoelectric resonator having the sandwich structure, since the vibrating part is hermetically sealed without using any adhesive, it is possible to prevent thermal convection by outgas generated by the adhesive from affecting. That is, when the adhesive is used, the thermal convection may be generated, in the space in which the vibrating part is hermetically sealed, by circulation of outgas generated by the adhesive, which may prevent the temperature of the vibrating part from being accurately adjusted. However, the piezoelectric resonator having the sandwich structure does not generate outgas. Thus, it is possible to accurately control the temperature of the vibrating part.

In the above-described configuration, it is preferable that the piezoelectric resonator plate includes: the vibrating part formed so as to have a substantially rectangular shape; an external frame part surrounding an outer periphery of the vibrating part; and a connecting part connecting the vibrating part to the external frame part. Also, it is preferable that the oscillation IC is overlapped with at least part of the external frame part of the piezoelectric resonator plate in plan view.

With the above-described configuration, since the heat of the oscillation IC is easily transferred to the vibrating part of the piezoelectric resonator plate via the external frame part, it is possible to further homogenize the temperature of the core section.

Effects of the Invention

In an oven-controlled crystal oscillator of the present invention, a core section has a layered structure made of an oscillation IC, a piezoelectric resonator and a heater IC, which results in the piezoelectric resonator, the oscillation IC and the heater IC being disposed close to each other as much as possible. Thus, it is possible to stabilize oscillation frequency.

MODE FOR CARRYING OUT THE INVENTION

Hereinafter, an embodiment of the present invention will be described with reference to the drawings.

Figure 1:
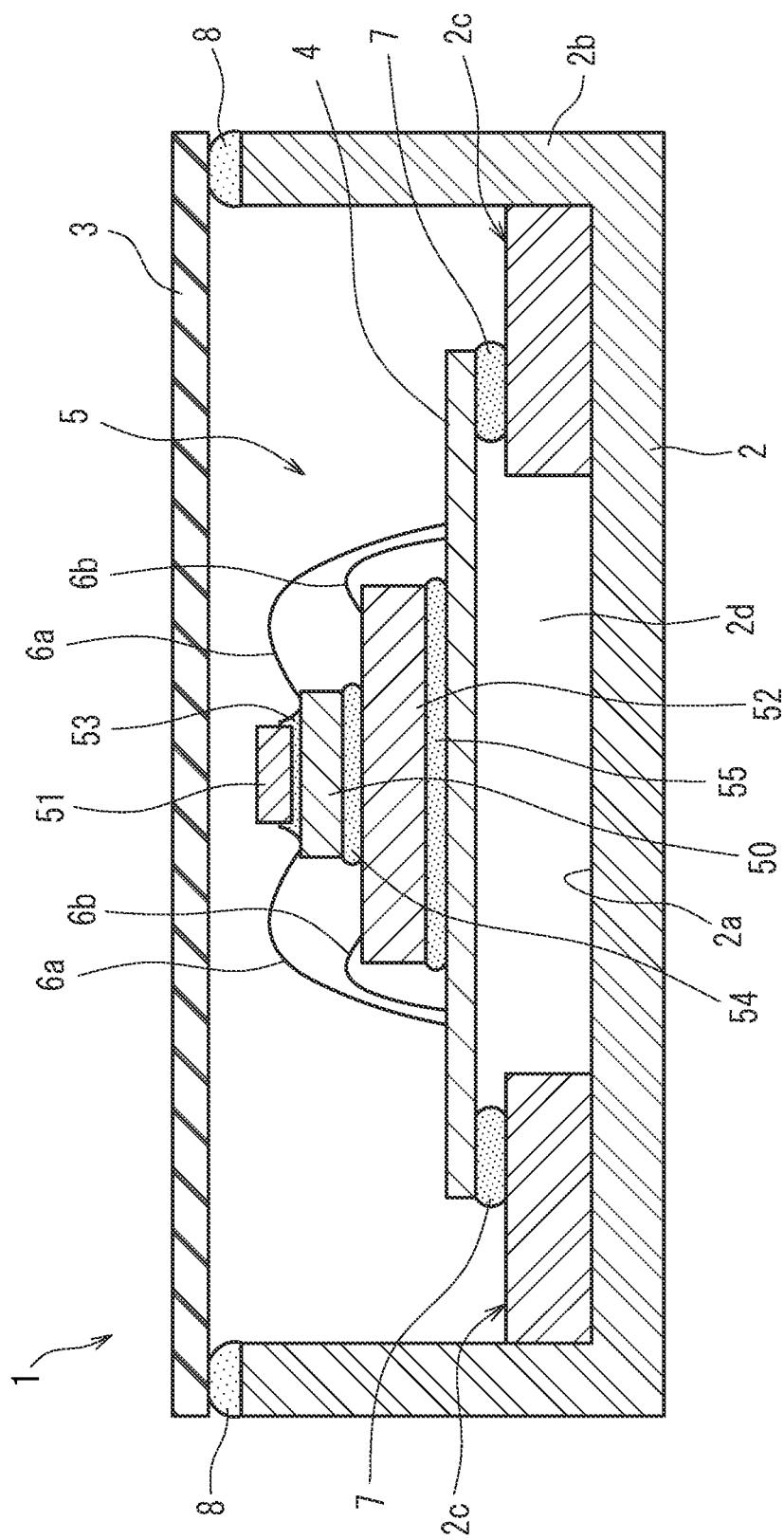
FIG. 1 is a cross-sectional view illustrating a schematic configuration of an OCXO according to an embodiment.

As shown in FIG. 1, an OCXO 1 according to this embodiment has a configuration in which a core section 5 is disposed in a package (housing) 2 made of ceramic or the like and having a substantially rectangular parallelepiped shape such that the core section 5 is hermetically sealed by a lid 3. The package 2 has, for example, a package size of 7.0×5.0 mm. The package 2 includes a recess part 2a whose upper part is opened, and the core section 5 is hermetically encapsulated in the recess part 2a. To an upper surface of a peripheral wall part 2b that surrounds the recess part 2a, the lid 3 is fixed by a sealant 8. Thus, the inside of the package 2 is hermetically sealed (in an airtight state). As the sealant 8, a metal sealant such as Au-Su alloy or solder is suitably used, however, other sealants including low melting point glass may also be used. The space inside the package 2 is preferably a vacuum atmosphere or an atmosphere with low thermal conductivity with low pressure nitrogen or low pressure argon.

Step parts 2c are formed on an inner wall surface of the peripheral wall part 2b of the package 2 so as to be along the arrangement of connection terminals (not shown). The core section 5 is connected to the connection terminals formed on the step parts 2c via a plate-like core substrate 4. The core substrate 4 is made of a resin material having heat resistance and flexibility such as polyimide. The core substrate 4 may be made of crystal.

The core substrate 4 is disposed so as to be bridged between a facing pair of step parts 2c of the package 2. A space 2d is formed under the core substrate 4, between the pair of step parts 2c. Connection terminals formed on step surfaces of the step parts 2c are connected to connection terminals (not shown) formed on a rear surface 4b of the core substrate 4 via a conductive adhesive 7. Also, external terminals (not shown) formed on respective components of the core section 5 are connected to connection terminals 4c formed on a front surface 4a of the core substrate 4, by wire bonding via wires 6a and 6b. A polyimide adhesive or an epoxy adhesive is used, for example, as the conductive adhesive 7.

Figure 2:
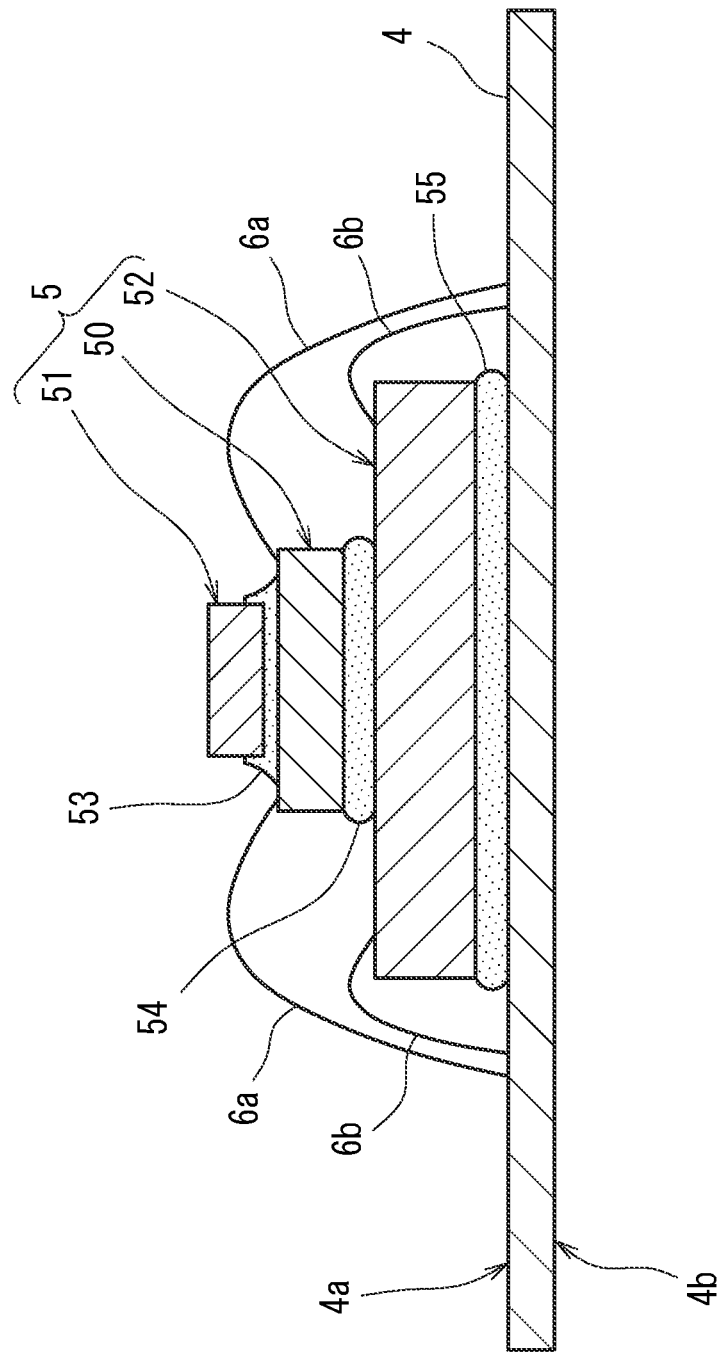
FIG. 2 is a cross-sectional view illustrating a schematic configuration of a core section and a core substrate of the OCXO of FIG. 1.
Figure 3:
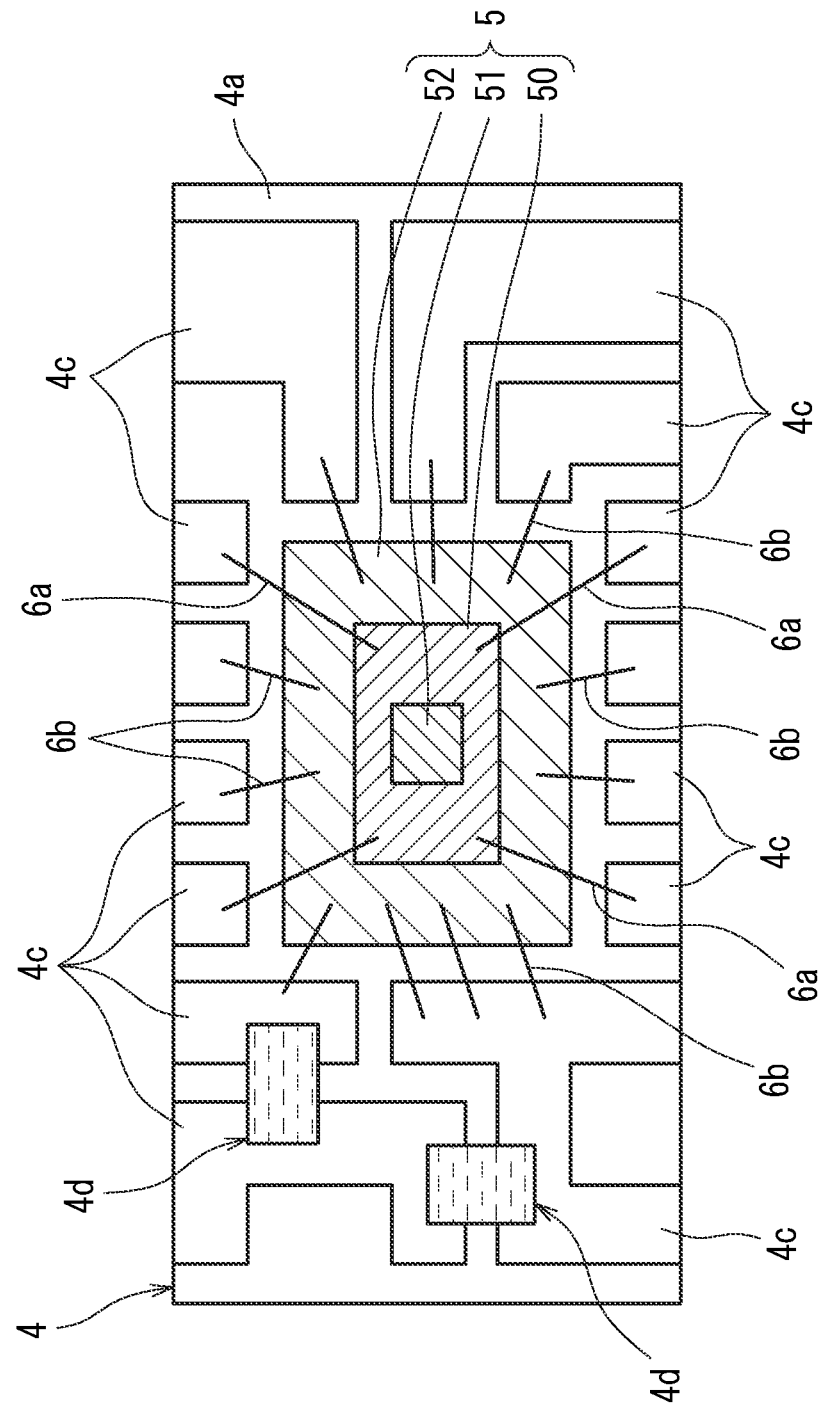
FIG. 3 is a plan view illustrating the core section and the core substrate of FIG. 2.

Here, the core section 5 is described referring to FIGS. 2 and 3. FIGS. 2 and 3 show the core section 5 mounted on the core substrate 4. The core section 5 packages various electronic components used for the OCXO 1, and has a three-layer structure (layered structure) in which an oscillation IC 51, a crystal resonator 50 and a heater IC 52 are laminated in this order from the uppermost layer side. The oscillation IC 51, the crystal resonator 50 and the heater IC 52 respectively have areas in plan view that become gradually smaller from the downside to the upside. The core section 5 stabilizes oscillation frequency of the OCXO 1 by especially adjusting the temperatures of the crystal resonator 50, the oscillation IC 51 and the heater IC 52, whose temperature characteristics are large. The electronic components of the core section 5 are not sealed by a sealing resin, however, depending on the sealing atmosphere, the electronic components may be sealed by the sealing resin.

A crystal oscillator 100 is constituted of the crystal resonator 50 and the oscillation IC 51. The oscillation IC 51 is mounted on the crystal resonator 50 via a plurality of metal bumps 51a (see FIG. 4). The oscillation frequency of the OCXO 1 is controlled by controlling the piezoelectric vibration of the crystal resonator 50 by the oscillation IC 51. The crystal oscillator 100 will be described later in detail.

Between the facing surfaces of the crystal resonator 50 and the oscillation IC 51, a non-conductive adhesive (underfill) 53 is interposed, which fixes the respective facing surfaces of the crystal resonator 50 and the oscillation IC 51 to each other. In this case, the front surface (a first main surface 201 of a first sealing member 20) of the crystal resonator 50 is bonded to the rear surface of the oscillation IC 51 via the non-conductive adhesive 53. As the non-conductive adhesive 53, a polyimide adhesive or an epoxy adhesive is, for example, used. Also, external terminals (electrode patterns 22 shown in FIG. 5) formed on the front surface of the crystal resonator 50 are connected to the connection terminals 4c formed on the front surface 4a of the core substrate 4, by wire bonding via the wires 6a.

The oscillation IC 51 has the area smaller than the area of the crystal resonator 50 in plan view. Thus, the whole oscillation IC 51 is disposed within the area of the crystal resonator 50 in plan view. Also, all the rear surface of the oscillation IC 51 is bonded to the front surface (the first main surface 201 of the first sealing member 20) of the crystal resonator 50.

The heater IC 52 has a configuration in which a heating element (a heat source), a control circuit for controlling the temperature of the heating element (a current control circuit) and a temperature sensor for detecting the temperature of the heating element are integrally formed. By controlling the temperature of the core section 5 by the heater IC 52, it is possible to keep the temperature of the core section 5 substantially constant, which contributes to stabilization of the oscillation frequency of the OCXO 1.

Between the facing surfaces of the crystal resonator 50 and the heater IC 52, a non-conductive adhesive (underfill) 54 is interposed, which fixes the respective facing surfaces of the crystal resonator 50 and the heater IC 52 to each other. In this case, the rear surface (a second main surface 302 of a second sealing member 30) of the crystal resonator 50 is bonded to the front surface of the heater IC 52 via the non-conductive adhesive 54. As the non-conductive adhesive 54, a polyimide adhesive or an epoxy adhesive is, for example, used. Also, external terminals (not shown) formed on the front surface of the heater IC 52 are connected to the connection terminals 4c formed on the front surface 4a of the core substrate 4, by wire bonding via the wires 6b.

The crystal resonator 50 has the area smaller than the area of the heater IC 52 in plan view. Thus, the whole crystal resonator 50 is disposed within the area of the heater IC 52 in plan view. Also, all the rear surface of the crystal resonator 50 (the second main surface 302 of the second sealing member 30) is bonded to the front surface of the heater IC 52.

Between the facing surfaces of the heater IC 52 and the core substrate 4, a conductive adhesive 55 is interposed, which fixes the respective facing surfaces of the heater IC 52 and the core substrate 4 to each other. In this case, the rear surface of the heater IC 52 is bonded to the front surface 4a of the core substrate 4 via the conductive adhesive 55. Thus, the heater IC 52 is connected to ground via the conductive adhesive 55 and the core substrate 4. As the conductive adhesive 55, a polyimide adhesive or an epoxy adhesive is, for example, used. In the case where the heater IC 52 is connected to ground via wires or the like, a non-conductive adhesive such as the non-conductive adhesives 53 and 54 may be used in place of the conductive adhesive.

On the front surface 4a of the core substrate 4, various connection terminals 4c are formed as described above. Also, on the front surface 4a of the core substrate 4, a plurality of (in FIG. 3, two) chip capacitors (bypass capacitors) 4d is disposed. However, the size or the number of the chip capacitors 4d is not particularly limited.

Although the kind of the crystal resonator 50 used for the core section 5 is not particularly limited, a device having a sandwich structure is suitably used, which serves to make the device thinner. The device having the sandwich structure is constituted of: the first sealing member and the second sealing member both made of glass or crystal; and a piezoelectric resonator plate made of, for example, crystal. The piezoelectric resonator plate includes a vibrating part, on respective main surfaces of which excitation electrodes are formed. The first sealing member and the second sealing member are laminated and bonded via the piezoelectric resonator plate. Thus, the vibrating part of the piezoelectric resonator plate is hermetically sealed in an internal sp ace.

The crystal oscillator 100 integrally formed by the sandwich-structured crystal resonator 50 and the oscillation IC 51 is described referring to FIGS. 4 to 10.

Figure 4:
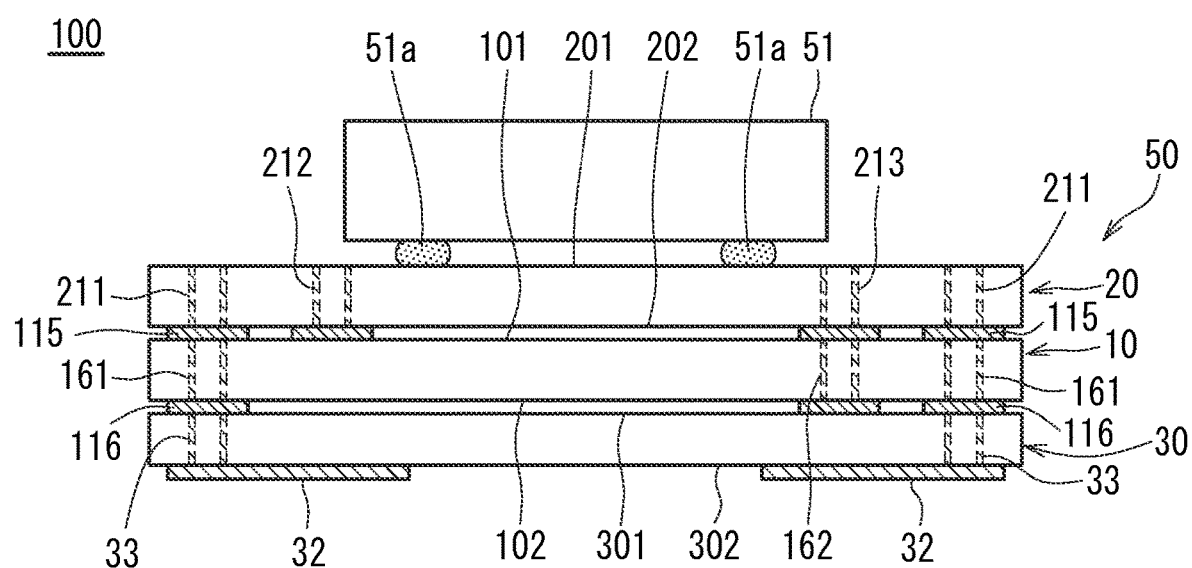
FIG. 4 is a schematic configuration diagram schematically illustrating a configuration of a crystal oscillator (a crystal resonator and an oscillation IC) of the core section of FIG. 2.

As shown in FIG. 4, the crystal oscillator 100 includes: a crystal resonator plate (piezoelectric resonator plate) 10; the first sealing member 20; the second sealing member 30; and the oscillation IC 51. In this crystal oscillator 100, the crystal resonator plate 10 is bonded to the first sealing member 20, and furthermore the crystal resonator plate 10 is bonded to the second sealing member 30. Thus, a package having a sandwich structure is formed so as to have a substantially rectangular parallelepiped shape. In the crystal oscillator 100, the first sealing member 20 and the second sealing member 30 are bonded to respective main surfaces of the crystal resonator plate 10, thus an internal space (cavity) of the package is formed. In this internal space, a vibrating part 11 (see FIGS. 7 and 8) is hermetically sealed.

The crystal oscillator 100 has, for example, a package size of 1.0×0.8 mm, which is reduced in size and height. According to the size reduction, no castellation is formed in the package. Through holes are used for conduction between electrodes. The oscillation IC 51 mounted on the first sealing member 20 is a one-chip integrated circuit element constituting, with the crystal resonator plate 10, an oscillation circuit. Also, the crystal oscillator 100 is mounted on the above-described heater IC 52 via the non-conductive adhesive 54.

Figure 7:
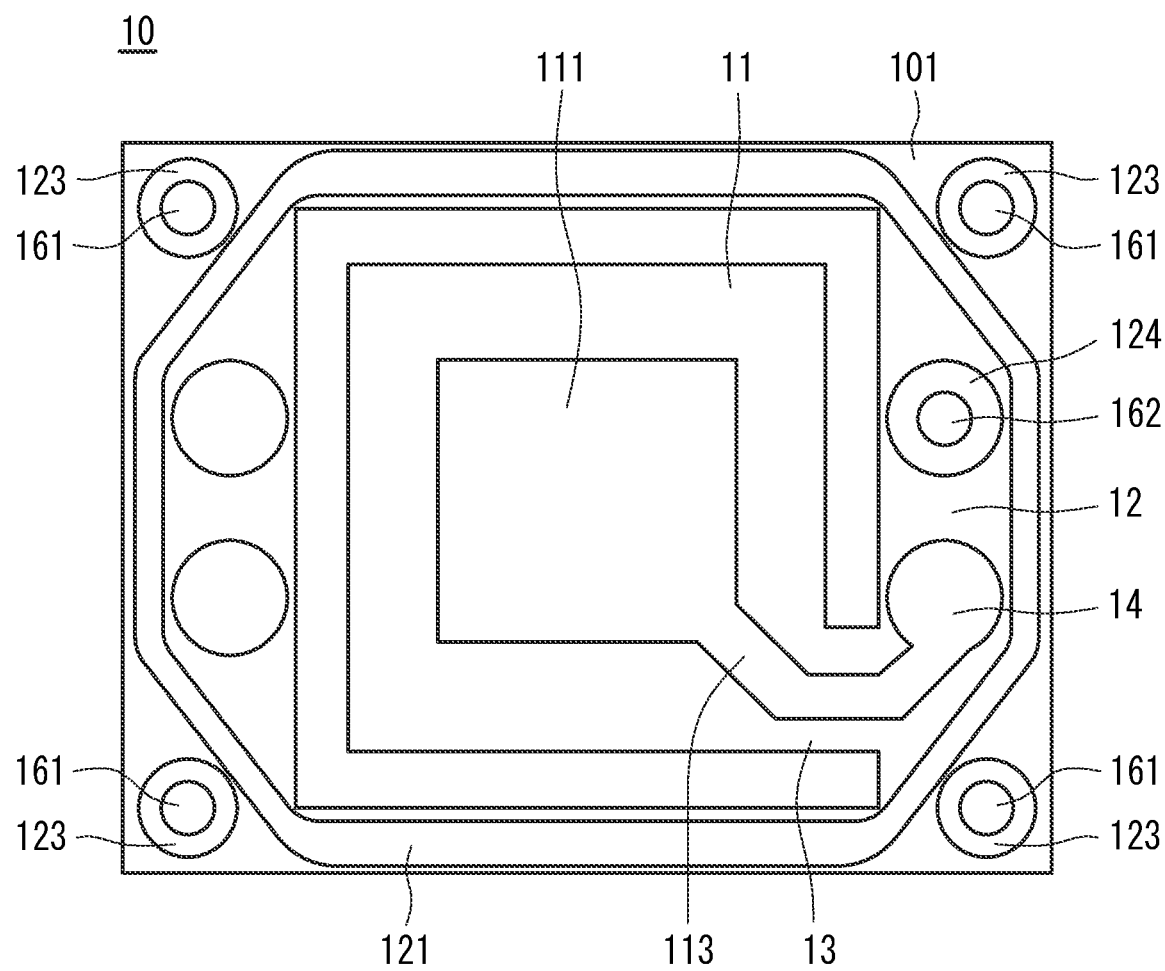
FIG. 7 is a schematic plan view illustrating a first main surface of a crystal resonator plate of the crystal oscillator of FIG. 4.
Figure 8:
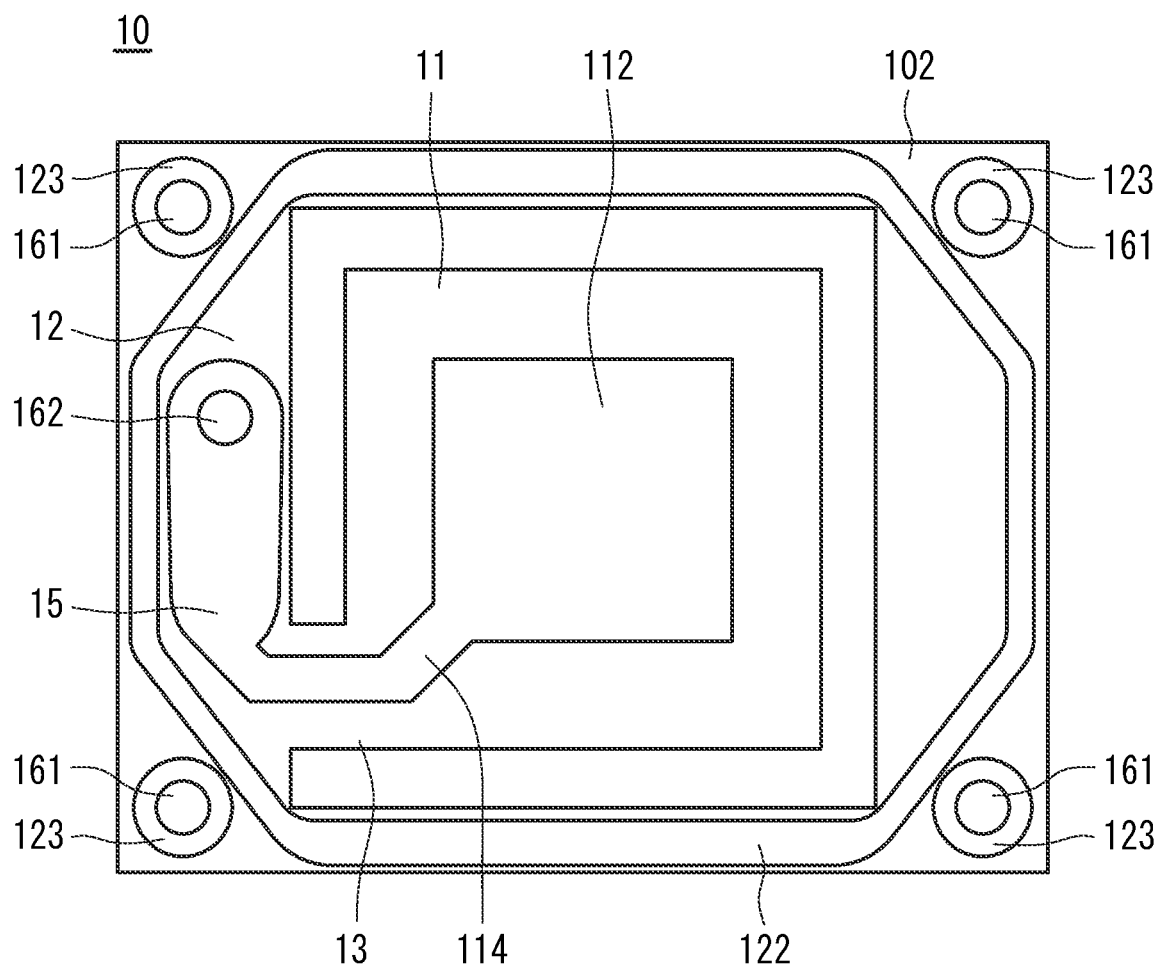
FIG. 8 is a schematic plan view illustrating a second main surface of the crystal resonator plate of the crystal oscillator of FIG. 4.

The crystal resonator plate 10 is a piezoelectric substrate made of crystal as shown in FIGS. 7 and 8. Each main surface (i.e. a first main surface 101 and a second main surface 102) is formed as a smooth flat surface (mirror-finished). An AT-cut crystal plate that causes thickness shear vibration is used as the crystal resonator plate 10. In the crystal resonator plate 10 shown in FIGS. 7 and 8, each main surface 101 and 102 of the crystal resonator plate 10 is an XZ' plane. On this XZ' plane, the direction parallel to the lateral direction (short side direction) of the crystal resonator plate 10 is the X axis direction, and the direction parallel to the longitudinal direction (long side direction) of the crystal resonator plate 10 is the Z' axis direction.

A pair of excitation electrodes (i.e. a first excitation electrode 111 and a second excitation electrode 112) is formed, respectively, on the main surfaces 101 and 102 of the crystal resonator plate 10. The crystal resonator plate 10 includes: the vibrating part 11 formed so as to have a substantially rectangular shape; an external frame part 12 surrounding the outer periphery of the vibrating part 11; and a support part (connecting part) 13 that supports the vibrating part 11 by connecting the vibrating part 11 to the external frame part 12. That is, the crystal resonator plate 10 has a configuration in which the vibrating part 11, the external frame part 12 and the support part 13 are integrally formed. The support part 13 extends (protrudes) from only one corner part positioned in the +X direction and in the −Z' direction of the vibrating part 11 to the external frame part 12 in the −Z' direction.

The first excitation electrode 111 is provided on the first main surface 101 side of the vibrating part 11 while the second excitation electrode 112 is provided on the second main surface 102 side of the vibrating part 11. The first excitation electrode 111 and the second excitation electrode 112 are respectively connected to lead-out wirings (a first lead-out wiring 113 and a second lead-out wiring 114) so that these excitation electrodes are connected to external electrode terminals. The first lead-out wiring 113 is drawn from the first excitation electrode 111 and connected to a connection bonding pattern 14 formed on the external frame part 12 via the support part 13. The second lead-out wiring 114 is drawn from the second excitation electrode 112 and connected to a connection bonding pattern 15 formed on the external frame part 12 via the support part 13.

Resonator-plate-side sealing parts to bond the crystal resonator plate respectively to the first sealing member 20 and the second sealing member 30 are provided on the respective main surfaces (i.e. the first main surface 101 and the second main surface 102) of the crystal resonator plate 10. As the resonator-plate-side sealing part on the first main surface 101, a resonator-plate-side first bonding pattern 121 is formed. As the resonator-plate-side sealing part on the second main surface 102, a resonator-plate-side second bonding pattern 122 is formed. The resonator-plate-side first bonding pattern 121 and the resonator-plate-side second bonding pattern 122 are each formed on the external frame part 12 so as to have an annular shape in plan view.

Also, as shown in FIGS. 7 and 8, five through holes are formed in the crystal resonator plate 10 so as to penetrate between the first main surface 101 and the second main surface 102. More specifically, four first through holes 161 are respectively disposed in the four corners (corner parts) of the external frame part 12. A second through hole 162 is disposed in the external frame part 12, on one side in the Z' axis direction relative to the vibrating part 11 (in FIGS. 7 and 8, on the side of the −Z' direction). Connection bonding patterns 123 are formed on the respective peripheries of the first through holes 161. Also, on the periphery of the second through hole 162, a connection bonding pattern 124 is formed on the first main surface 101 side while the connection bonding pattern 15 is formed on the second main surface 102 side.

In the first through holes 161 and the second through hole 162, through electrodes are respectively formed along a corresponding inner wall surface of the above through holes so as to establish conduction between the electrodes formed on the first main surface 101 and the second main surface 102. Respective center parts of the first through holes 161 and the second through hole 162 are hollow penetrating parts penetrating between the first main surface 101 and the second main surface 102.

Figure 5:
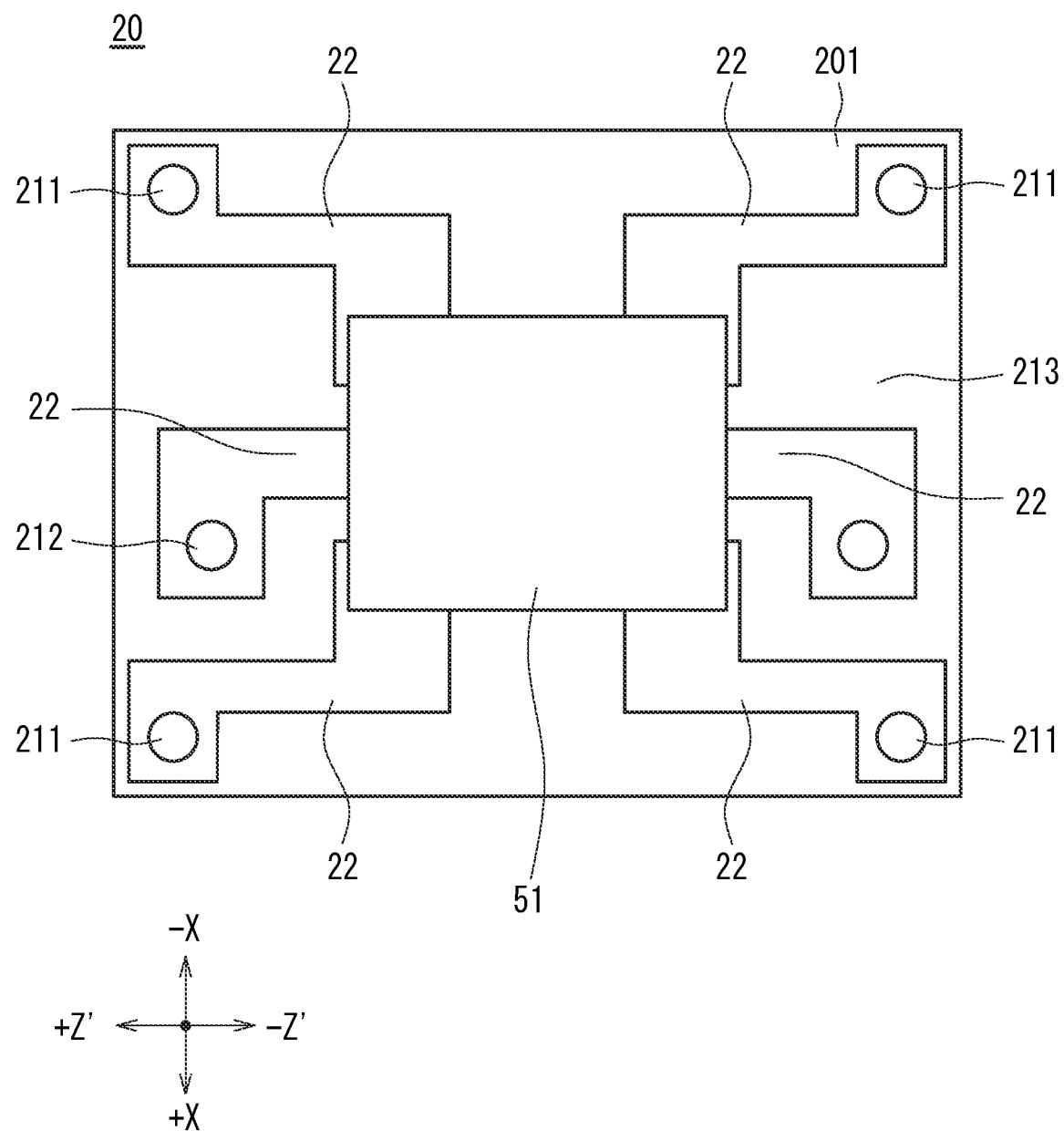
FIG. 5 is a schematic plan view illustrating a first main surface of a first sealing member of the crystal oscillator of FIG. 4.
Figure 6:
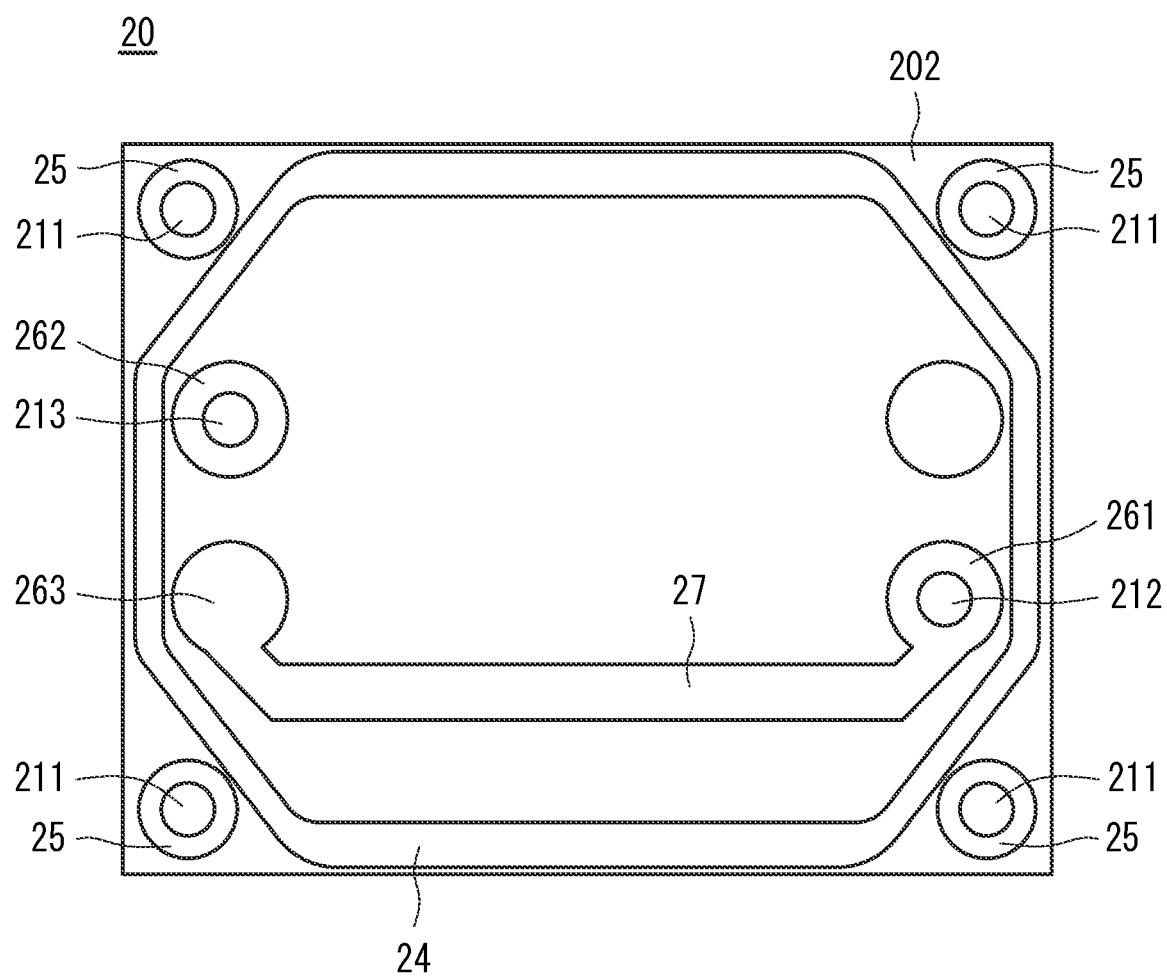
FIG. 6 is a schematic plan view illustrating a second main surface of the first sealing member of the crystal oscillator of FIG. 4.

As shown in FIGS. 5 and 6, the first sealing member 20 is a substrate having a rectangular parallelepiped shape that is made of a single AT-cut crystal plate. A second main surface 202 (a surface to be bonded to the crystal resonator plate 10) of the first sealing member 20 is formed as a smooth flat surface (mirror finished). By making the first sealing member 20, which does not have the vibrating part, of the AT-cut crystal plate as in the case of the crystal resonator plate 10, it is possible for the first sealing member 20 to have the same coefficient of thermal expansion as the crystal resonator plate 10. Thus, it is possible to prevent thermal deformation of the crystal oscillator 100. Furthermore, the respective directions of the X axis, Y axis and Z' axis of the first sealing member 20 are the same as those of the crystal resonator plate 10.

As shown in FIG. 5, on the first main surface 201 of the first sealing member 20, six electrode patterns 22 are formed, which include mounting pads for mounting the oscillation IC 51 as an oscillation circuit element. The oscillation IC 51 is bonded to the electrode patterns 22 by the flip chip bonding (FCB) method using the metal bumps (for example, Au bumps) 51a (see FIG. 4). Also in this embodiment, among the six electrode patterns 22, the electrode patterns 22 disposed in the four corners (corner parts) of the first main surface 201 of the first sealing member 20 are connected to the connection terminals 4c formed on the front surface 4a of the core substrate 4 as described above, via the wires 6a. In this way, the oscillation IC 51 is electrically connected to the outside via the wires 6a, the core substrate 4, the package 2 and the like.

As shown in FIGS. 5 and 6, six through holes are formed in the first sealing member 20 so as to be respectively connected to the six electrode patterns 22 and also to penetrate between the first main surface 201 and the second main surface 202. More specifically, four third through holes 211 are respectively disposed in the four corners (corner parts) of the first sealing member 20. Fourth and fifth through holes 212 and 213 are disposed respectively in the +Z' direction and in the −Z' direction in FIGS. 5 and 6.

In the third through holes 211 and the fourth and fifth through holes 212 and 213, through electrodes are respectively formed along a corresponding inner wall surface of the above through holes so as to establish conduction between the electrodes formed on the first main surface 201 and the second main surface 202. Respective center parts of the third through holes 211 and the fourth and fifth through holes 212 and 213 are hollow penetrating parts penetrating between the first main surface 201 and the second main surface 202.

On the second main surface 202 of the first sealing member 20, a sealing-member-side first bonding pattern 24 is formed as a sealing-member-side first sealing part so as to be bonded to the crystal resonator plate 10. The sealing-member-side first bonding pattern 24 is formed so as to have an annular shape in plan view.

On the second main surface 202 of the first sealing member 20, connection bonding patterns 25 are respectively formed on the peripheries of the third through holes 211. A connection bonding pattern 261 is formed on the periphery of the fourth through hole 212, and a connection bonding pattern 262 is formed on the periphery of the fifth through hole 213. Furthermore, a connection bonding pattern 263 is formed on the side opposite to the connection bonding pattern 261 in the long axis direction of the first sealing member 20 (i.e. on the side of the −Z' direction). The connection bonding pattern 261 and the connection bonding pattern 263 are connected to each other via a wiring pattern 27.

Figure 9:
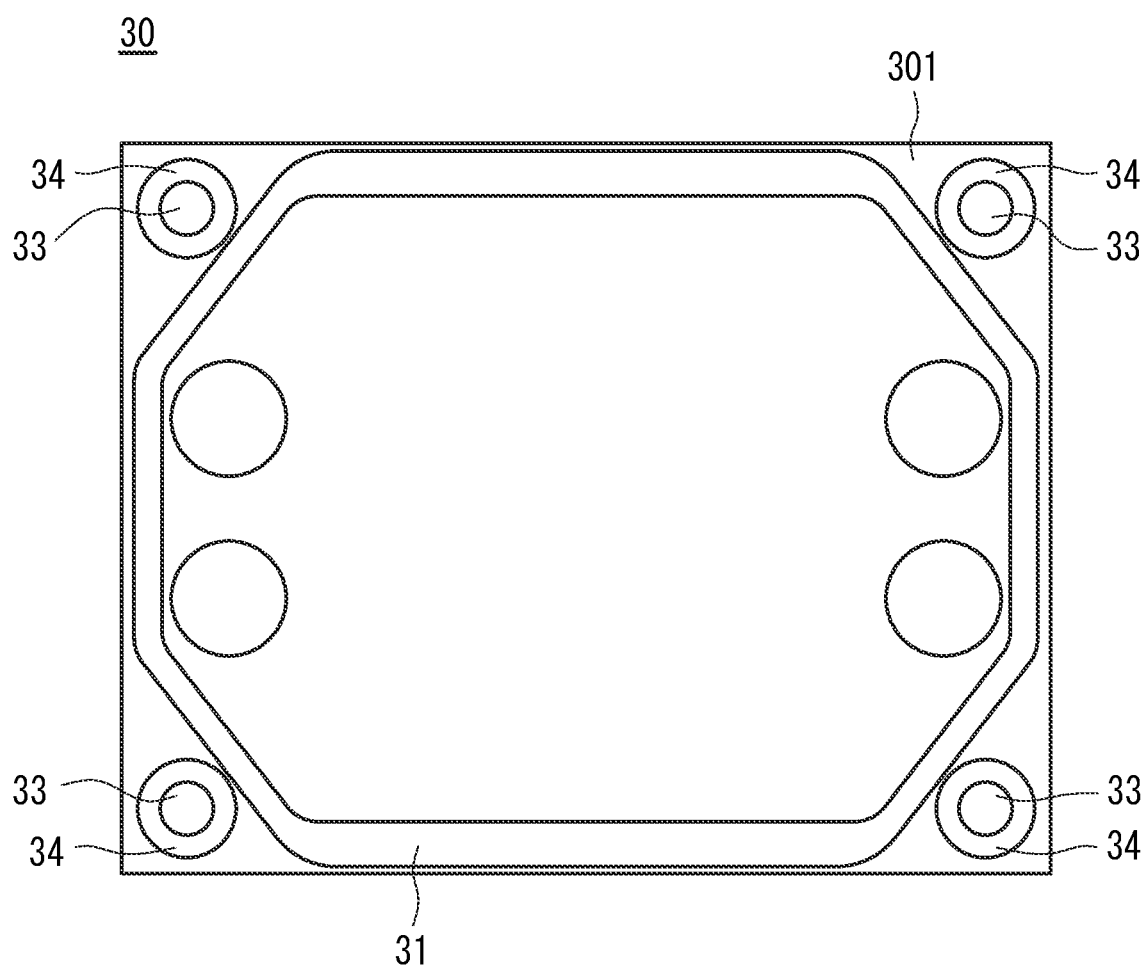
FIG. 9 is a schematic plan view illustrating a first main surface of a second sealing member of the crystal oscillator of FIG. 4.
Figure 9:
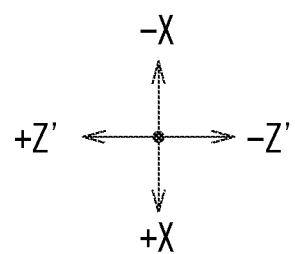
Figure 10:
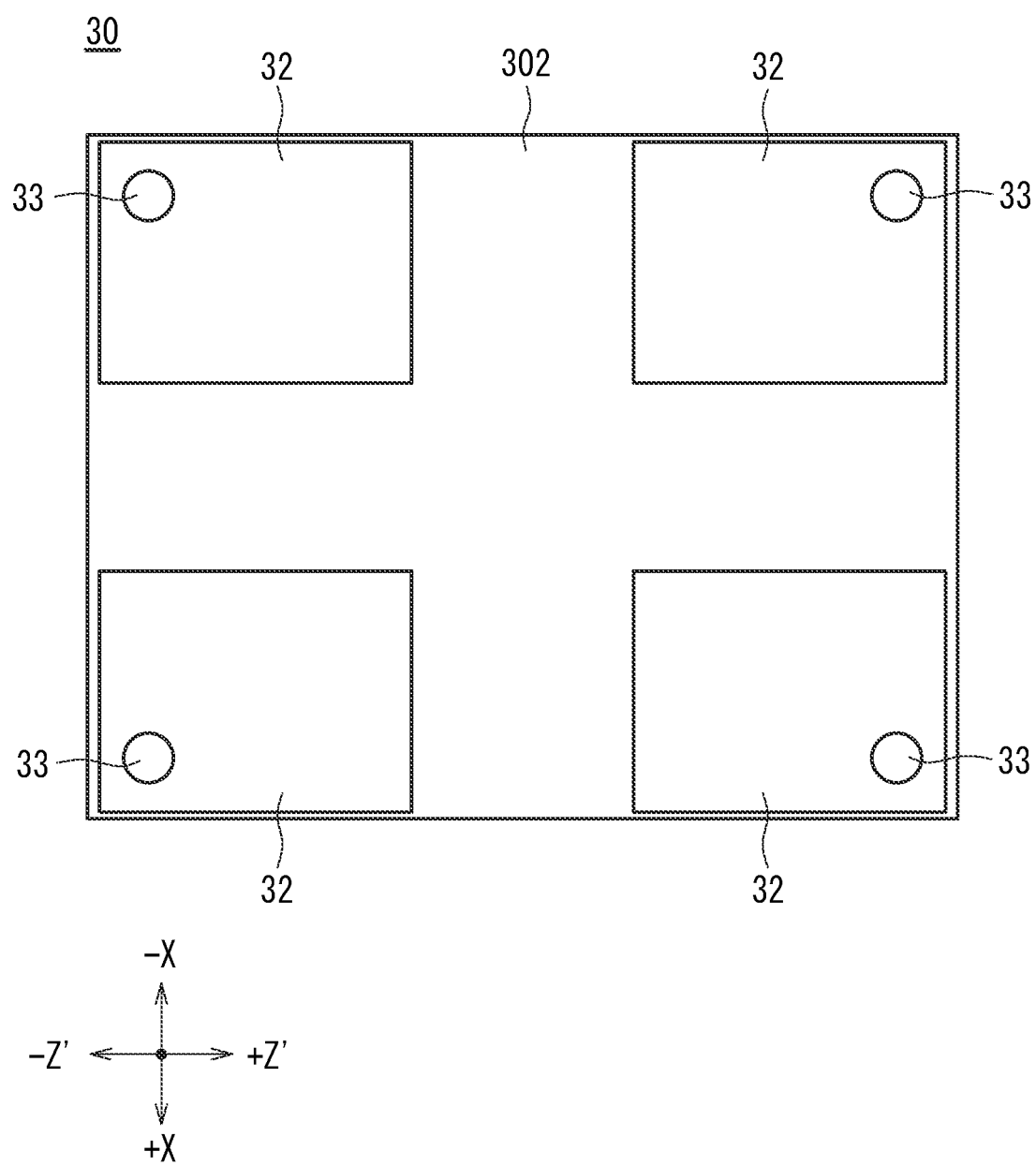
FIG. 10 is a schematic plan view illustrating a second main surface of the second sealing member of the crystal oscillator of FIG. 4.

As shown in FIGS. 9 and 10, the second sealing member 30 is a substrate having a rectangular parallelepiped shape that is made of a single AT-cut crystal plate. A first main surface 301 (a surface to be bonded to the crystal resonator plate 10) of the second sealing member is formed as a smooth flat surface (mirror finished). The second sealing member 30 is also preferably made of an AT-cut crystal plate as in the case of the crystal resonator plate 10, and the respective directions of the X axis, Y axis and Z' axis of the second sealing member 30 are preferably the same as those of the crystal resonator plate 10.

On the first main surface 301 of the second sealing member 30, a sealing-member-side second bonding pattern 31 is formed as a sealing-member-side second sealing part so as to be bonded to the crystal resonator plate 10. The sealing-member-side second bonding pattern 31 is formed so as to have an annular shape in plan view.

On the second main surface 302 of the second sealing member 30, four external electrode terminals 32 are formed. The external electrode terminals 32 are respectively located on the four corners (corner parts) on the second main surface 302 of the second sealing member 30. In this embodiment, the electrical connection to the outside is carried out via the electrode patterns 22 and the wires 6a as described above. However, it is also possible to carry out the electrical connection to the outside via the electrode terminals 32.

As shown in FIGS. 9 and 10, four through holes are formed in the second sealing member 30 so as to penetrate between the first main surface 301 and the second main surface 302. More specifically, four sixth through holes 33 are respectively disposed in the four corners (corner parts) of the second sealing member 30. In the sixth through holes 33, through electrodes are respectively formed along a corresponding inner wall surface of the sixth through holes 33 so as to establish conduction between the electrodes formed on the first main surface 301 and the second main surface 302. In this way, the respective electrodes formed on the first main surface 301 are electrically conducted to the electrode terminals 32 formed on the second main surface 302 via the through electrodes formed along the inner wall surfaces of the sixth through holes 33. Also, respective central parts of the sixth through holes 33 are hollow penetrating parts penetrating between the first main surface 301 and the second main surface 302. On the first main surface 301 of the second sealing member 30, connection bonding patterns 34 are respectively formed on the peripheries of the sixth through holes 33. When the electrical connection to the outside is not carried out via the electrode terminals 32, it is not necessarily required to provide the electrode terminals 32, the sixth through holes 33 and the like.

In the crystal oscillator 100 including the crystal resonator plate 10, the first sealing member 20 and the second sealing member 30, the crystal resonator plate 10 and the first sealing member 20 are subjected to the diffusion bonding in a state in which the resonator-plate-side first bonding pattern 121 and the sealing-member-side first bonding pattern 24 are superimposed on each other, and the crystal resonator plate 10 and the second sealing member 30 are subjected to the diffusion bonding in a state in which the resonator-plate-side second bonding pattern 122 and the sealing-member-side second bonding pattern 31 are superimposed on each other, thus, the package having the sandwich structure as shown in FIG. 4 is produced. Accordingly, the internal space of the package, i.e. the space to house the vibrating part 11 is hermetically sealed.

In this case, the respective connection bonding patterns as described above are also subjected to the diffusion bonding in a state in which they are each superimposed on the corresponding connection bonding pattern. Such bonding between the connection bonding patterns allows electrical conduction of the first excitation electrode 111, the second excitation electrode 112, the oscillation IC 51 and the external electrode terminals 32 of the crystal oscillator 100.

More specifically, the first excitation electrode 111 is connected to the oscillation IC 51 via the first lead-out wiring 113, the wiring pattern 27, the fourth through hole 212 and the electrode pattern 22 in this order. The second excitation electrode 112 is connected to the oscillation IC 51 via the second lead-out wiring 114, the second through hole 162, the fifth through hole 213 and the electrode pattern 22 in this order.

In the crystal oscillator 100, the bonding patterns are each preferably made of a plurality of layers laminated on the crystal plate, specifically, a Ti (titanium) layer and an Au (gold) layer deposited by the vapor deposition in this order from the lowermost layer side. Also, the other wirings and electrodes formed on the crystal oscillator 100 each preferably have the same configuration as the bonding patterns, which leads to patterning of the bonding patterns, the wirings and the electrodes at the same time.

In the above-described crystal oscillator 100, sealing parts (seal paths) 115 and 116 that hermetically seal the vibrating part 11 of the crystal resonator plate 10 are formed so as to have an annular shape in plan view. The seal path 115 is formed by the diffusion bonding of the resonator-plate-side first bonding pattern 121 and the sealing-member-side first bonding pattern 24 as described above. The outer edge and the inner edge of the seal path 115 both have a substantially octagonal shape. In the same way, the seal path 116 is formed by the diffusion bonding of the resonator-plate-side second bonding pattern 122 and the sealing-member-side second bonding pattern 31 as described above. The outer edge and the inner edge of the seal path 116 both have a substantially octagonal shape.

In this embodiment as described above, the core section 5 is supported by the package 2 via the core substrate 4. Also, the core section 5 includes at least the oscillation IC 51, the crystal resonator 50 and the heater IC 52, and has a layered structure in which the oscillation IC 51, the crystal resonator 50 and the heater IC 52 are laminated in sequence. Thus, the current to be applied to the heating element is controlled by the heater IC 52 to adjust the temperature of the core section 5. As a result, the temperature of the core section 5 is kept substantially constant.

In this embodiment, since the core section 5 has a layered structure made of the oscillation IC 51, the crystal resonator 50 and the heater IC 52, the temperature of the core section 5 is controlled in a state in which the oscillation IC 51 and the crystal resonator 50 are located close to each other. Therefore, it is possible to reduce the difference in the temperature between the oscillation IC 51 and the crystal resonator 50, which leads to the temperature adjustment with high accuracy by the OCXO 1. Also, since the crystal resonator 50 is interposed between the oscillation IC 51 and the heater IC 52, the oscillation IC 51 is separated from the heater IC 52. Thus, it is possible to reduce oscillation frequency noise of the crystal resonator 50. Furthermore, since the core section 5 is fixed to the package 2 via the core substrate 4, stress from a mounting board on which the OCXO 1 is mounted is hardly transferred to the core section 5. Thus, it is possible to protect the core section 5.

Also, the respective facing surfaces of the oscillation IC 51 and the crystal resonator 50 are fixed to each other by the non-conductive adhesive 53. The respective facing surfaces of the crystal resonator 50 and the heater IC 52 are fixed to each other by the non-conductive adhesive 54. Furthermore, the respective facing surfaces of the heater IC 52 and the core substrate 4 are fixed to each other by the conductive adhesive 55. With this configuration, every pair of facing surfaces among the respective components of the core section 5 (the oscillation IC 51, the crystal resonator 50 and the heater IC 52) and the core substrate 4 is connected to each other via the adhesive. Thus, heat transfer easily occurs between the elements (i.e. the components of the core section 5 and the core substrate 4), which makes the core section 5 rapidly a thermal equilibrium state. Therefore, it is possible to adjust the temperature by the OCXO 1 with high accuracy.

In this embodiment, the oscillation IC 51, the crystal resonator 50 and the heater IC 52 respectively have areas in plan view that become gradually smaller from the downside to the upside. Thus, out of the oscillation IC 51 and the crystal resonator 50, the whole facing surface of one of them having a smaller area (i.e. the oscillation IC 51) is bonded to the facing surface of the other of them (i.e. the crystal resonator 50). Also, out of the crystal resonator 50 and the heater IC 52, the whole facing surface of one of them having a smaller area (i.e. the crystal resonator 50) is bonded to the facing surface of the other of them (i.e. the heater IC 52). With this configuration, out of the components of the core section 5, the whole bonding surface of the component having the smaller area in plan view is bonded to the bonded surface of the component having the larger area. Thus, it is possible to homogenize the temperature of the core section 5. Also, all the rear surface of the heater IC 52 as the rear surface of the core section 5 is bonded to the core substrate 4. Thus, since all the rear surface of the core section 5 is bonded to the core substrate 4, it is possible to homogenize the temperature of the whole of core substrate 4 and core section 5 bonded thereto.

Also, a pair of step parts 2c facing each other is formed inside the package 2. The core substrate 4 is disposed so as to be bridged between the pair of step parts 2c. Thus, by providing the step parts 2c in the package 2, it is possible to easily fix the core section 5 inside the package 2. Also, since the space 2d is formed under the core substrate 4, it is possible to improve thermal insulation effectiveness.

Furthermore in this embodiment, the crystal resonator 50 having the sandwich structure is used as the piezoelectric resonator of the core section 5, which hermetically seals the vibrating part 11 in the inside and is capable of having a reduced height. Thus, it is possible to reduce the height and the size of the core section 5, and furthermore the heat capacity of the core section 5 can be reduced. Therefore, it is possible to reduce the heater calorific value of the OCXO 1, which leads to low power consumption. Furthermore, the temperature followability of the core section 5 can be improved, which also improves the stability of the OCXO 1. In addition, in the crystal resonator 50 having the sandwich structure, the vibrating part 11 is hermetically sealed without using any adhesive, as described above. Thus, it is possible to prevent thermal convection by outgas generated by the adhesive from affecting. That is, when the adhesive is used, the thermal convection may be generated, in the space in which the vibrating part 11 is hermetically sealed, by circulation of outgas generated by the adhesive, which may prevent the temperature of the vibrating part 11 from being accurately adjusted. However, the crystal resonator 50 having the sandwich structure does not generate outgas. Thus, it is possible to accurately control the temperature of the vibrating part 11.

When a heater substrate having a heater resistor is used as a heat source of the core section 5, such a heater substrate may have a large size. However, in this embodiment, it is possible to ensure a required heater calorific value without using the heater substrate having a large size. Thus, it is possible to further reduce the size of the core section 5 and to further decrease the heat capacity of the core section 5. In the case where the size of the core section 5 is not limited, it is possible to use a heater substrate having a heater resistor as a heat source of the core section 5.

The crystal resonator plate 10 includes: the vibrating part 11 formed so as to have a substantially rectangular shape; the external frame part 12 surrounding the outer periphery of the vibrating part 11; and the support part 13 that connects the vibrating part 11 to the external frame part 12. Also, the oscillation IC 51 is overlapped with at least part of the external frame part 12 of the crystal resonator plate 10 in plan view. Therefore, heat of the oscillation IC 51 is easily transferred to the vibrating part 11 of the crystal resonator plate 10 via the external frame part 12, which contributes to further homogenization of the temperature of the core section 5.

The package 2 suffers heat damage and over time damage due to hermetical sealing, aging, deterioration over time and the like. Thus, when a resin adhesive with low heat resistance is used as the adhesive (for example, the conductive adhesives 7 and 55, and the non-conductive adhesives 53 and 54), it may generate gas in the package 2 by decomposition or softening, which may affect high accuracy in the temperature adjustment by the OCXO 1. In this embodiment taking into account the above, a polyimide adhesive or an epoxy adhesive with low thermal conductivity and high heat resistance is used as the adhesive so as to prevent the above problems.

The present invention may be embodied in other forms without departing from the gist or essential characteristics thereof. The foregoing embodiment is therefore to be considered in all respects as illustrative and not limiting. The scope of the invention is indicated by the appended claims rather than by the foregoing description, and all modifications and changes that come within the meaning and range of equivalency of the claims are intended to be embraced therein.

In the above-described embodiment, the crystal resonator 50 having the sandwich structure is used as the piezoelectric resonator. However, the present invention is not limited thereto. A piezoelectric resonator having another structure may also be used. Furthermore, the oscillation IC 51 is mounted on the crystal resonator 50 by the FCB method using the metal bumps. However, the present invention is not limited thereto. The oscillation IC 51 may be mounted on the crystal resonator 50 by wire bonding or by using the conductive adhesive. Also, the heater IC 52 is mounted on the core substrate 4 by wire bonding. However, the present invention is not limited thereto. The heater IC 52 may be mounted on the core substrate 4 by the FCB method using the metal bumps or by using the conductive adhesive. Also, the crystal resonator 50 is electrically connected to the core substrate 4 by wire bonding. However, the present invention is not limited thereto. The crystal resonator 50 may be electrically connected to the core substrate 4 via the heater IC 52 by mounting the crystal resonator 50 on the heater IC 52 by the FCB method using the metal bumps or by using the conductive adhesive.

In the above-described embodiment, the core section 5 has a structure in which at least the oscillation IC 51, the crystal resonator 50 and the heater IC 52 are laminated in this order from the uppermost layer side. Contrarily, the core section 5 may have a structure in which at least the heater IC 52, the crystal resonator 50 and the oscillation IC 51 are laminated in this order from the uppermost layer side.

It is sufficient for the core section 5 to have a structure in which at least the oscillation IC 51, the crystal resonator 50 and the heater IC 52 are laminated in sequence. That is, a heater substrate or the like may be added to the layered structure made of the oscillation IC 51, the crystal resonator 50, and the heater IC 52. For example, the core section 5 may have a four-layer structure in which the heater substrate, the oscillation IC 51, the crystal resonator 50 and the heater IC 52 are laminated in this order from the uppermost layer side, or also may have a four-layer structure in which the heater IC 52, the crystal resonator 50, the oscillation IC 51 and the heater substrate are laminated in this order from the uppermost layer side. In these cases, it is possible to further homogenize the temperature of the core section by laminating the heater substrate as a heating element on the oscillation IC 51.

In the above-described embodiment, all the following pairs of facing surfaces are fixed by the adhesive (i.e. the non-conductive adhesives 53 and 54, and the conductive adhesive 55): the respective facing surfaces of the oscillation IC 51 and the crystal resonator 50; the respective facing surfaces of the crystal resonator 50 and the heater IC 52; and the respective facing surfaces of the heater IC 52 and the core substrate 4. However, the present invention is not limited thereto. It is sufficient that at least one of the following pairs of facing surfaces: i.e. the facing surfaces of the oscillation IC 51 and the crystal resonator 50, the facing surfaces of the crystal resonator 50 and the heater IC 52, and the facing surfaces of the heater IC 52 and the core substrate 4; is fixed by the adhesive. The rest pairs of facing surfaces may be fixed to each other by means other than the adhesive. In this case, it is only required that: out of the oscillation IC 51 and the crystal resonator 50, the whole of one of them having a smaller area (i.e. the oscillation IC 51) faces the other of them (i.e. the crystal resonator 50); out of the crystal resonator 50 and the heater IC 52, the whole of one of them having a smaller area (i.e. the crystal resonator 50) faces the other of them (i.e. the heater IC 52); and the whole of the rear surface of the core section 5 faces the core substrate 4.

The above adhesives (i.e. the non-conductive adhesives 53 and 54, and the conductive adhesive 55) are exemplarily described. Thus, any other material may be used provided that such a material is a thermal conductivity enhancer having a relatively high thermal conductivity. Apart from the above-described adhesives, examples of the thermal conductivity enhancer that can be used include: a resin film; a high thermal conductivity resin film; and a brazing filler metal. The high thermal conductivity resin film is a resin film made of, for example, a polyimide resin, an epoxy resin, or a silicone resin, whose thermal conductivity is not less than 1.0 W/m·K. The normal resin film without high thermal conductivity has a thermal conductivity of about 0.3 W/m·K.

Figure 11:
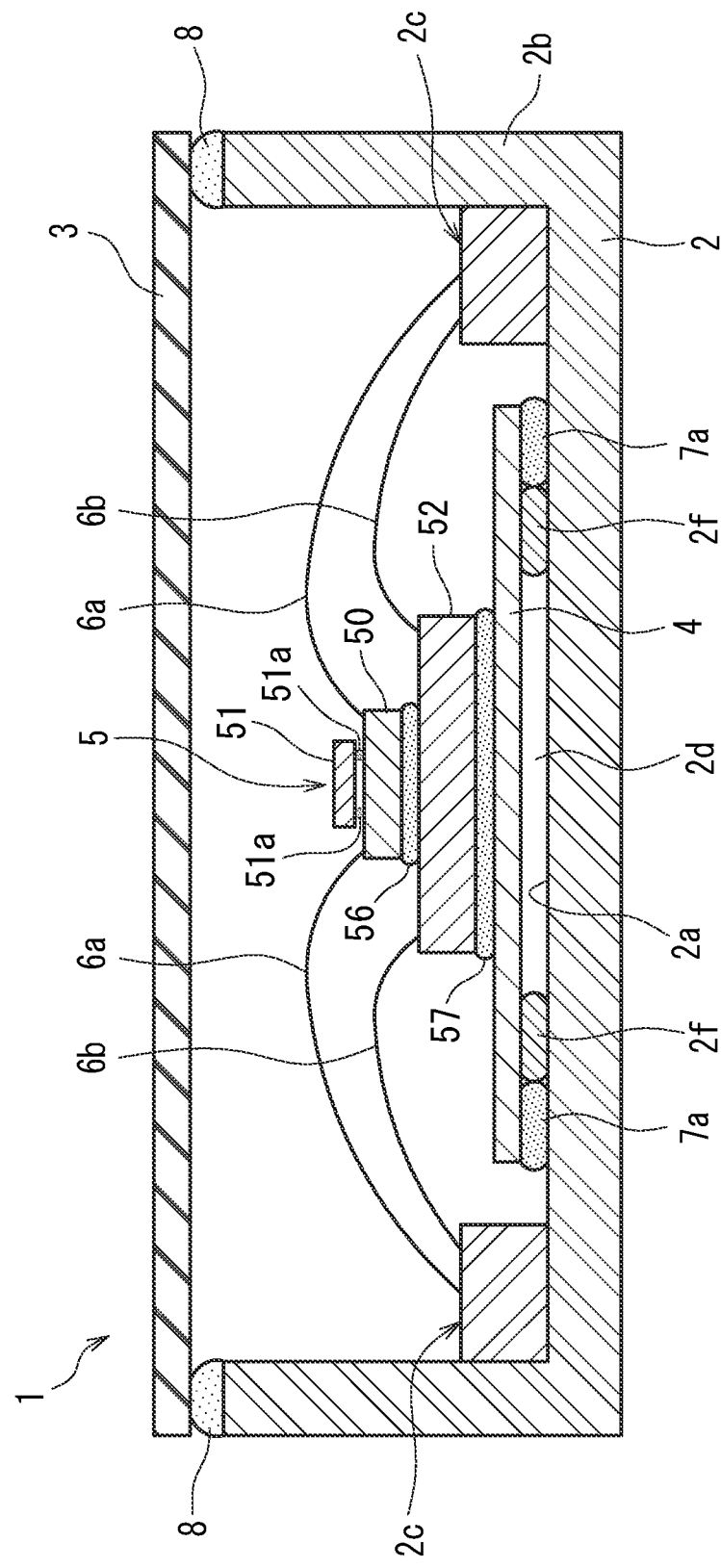
FIG. 11 is a cross-sectional view illustrating a schematic configuration of an OCXO according to variation 1.
Figure 12:
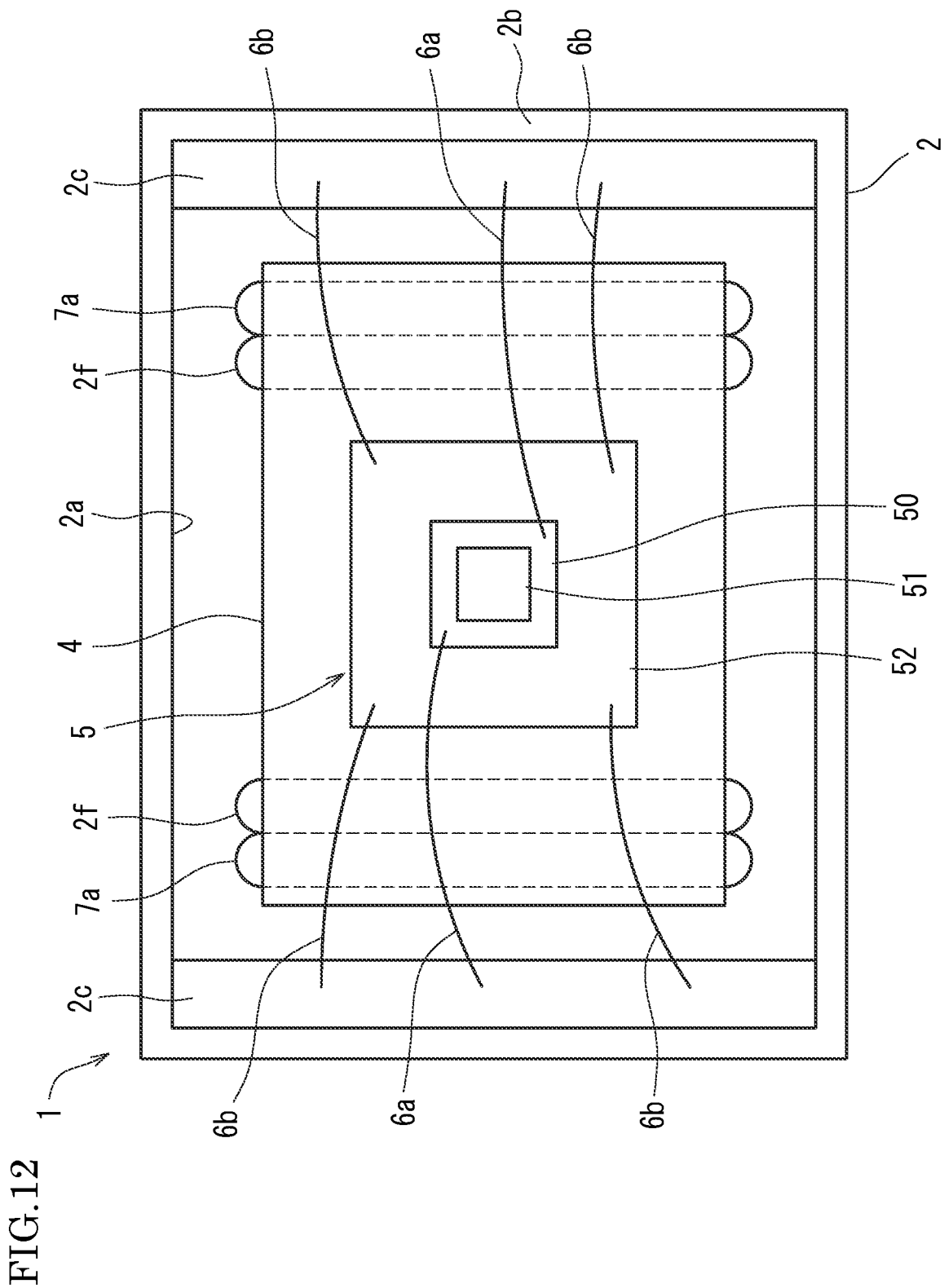
FIG. 12 is a plan view of the OCXO of FIG. 11.
Figure 13:
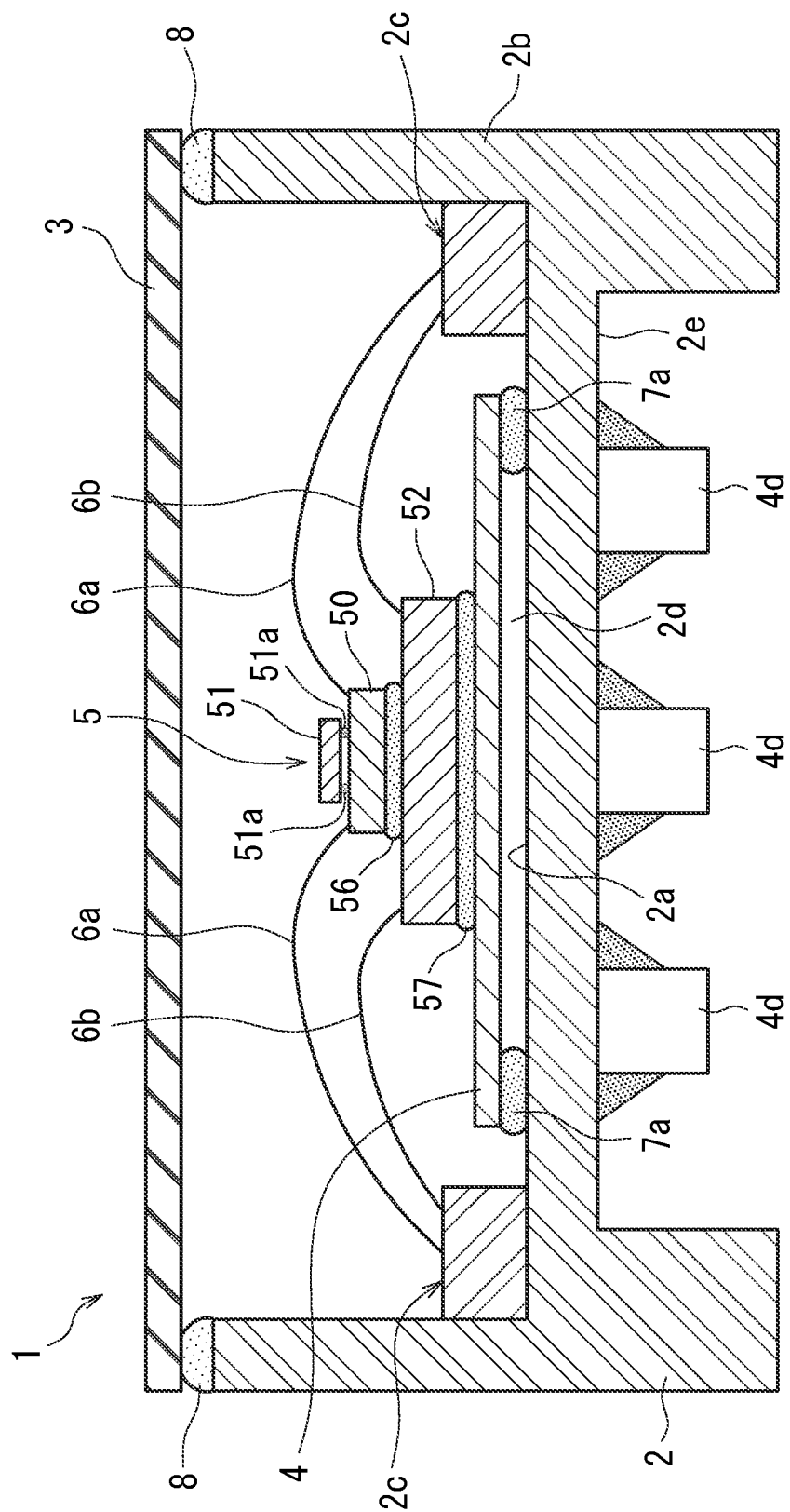
FIG. 13 is a cross-sectional view illustrating a schematic configuration of an OCXO according to variation 2.

For example, in variation 1 shown in FIGS. 11 and 12 and in variation 2 shown in FIG. 13, the respective facing surfaces of the crystal resonator 50 and the heater IC 52 are fixed to each other by a thermal conductivity enhancer 56, and the respective facing surfaces of the heater IC 52 and the core substrate 4 are fixed to each other by a thermal conductivity enhancer 57. In contrast, no underfill is interposed between the respective facing surfaces of the crystal resonator 50 and the oscillation IC 51. The respective facing surfaces of the crystal resonator 50 and the oscillation IC 51 are fixed to each other by a plurality of metal bumps 51a so as to avoid influence by stress caused by the thermal conductivity enhancer. In addition, another fixing material may be used to fix the respective facing surfaces of the crystal resonator 50 and the heater IC 52 to each other and to fix the respective facing surfaces of the heater IC 52 and the core substrate 4 to each other, not using the thermal conductivity enhancer.

In the above-described embodiment, the core section 5 is electrically connected to the package 2 via the core substrate 4. However, the core section 5 may be electrically connected to the package 2 not via the core substrate 4. That is, at least one of the oscillation IC 51, the crystal resonator 50 and the heater IC 52, which constitute the core section 5, may be electrically connected to the package 2 via wires. In the OCXO 1 according to this variation will be described referring to FIGS. 11 and 12. FIG. 11 is a cross-sectional view illustrating a schematic configuration of the OCXO 1 according to variation 1. FIG. 12 is a plan view of the OCXO 1 of FIG. 11.

A shown in FIGS. 11 and 12, the OCXO 1 according to variation 1 has a configuration in which the core section 5 is disposed in the package (housing) 2 made of ceramic or the like and having a substantially rectangular parallelepiped shape such that the core section 5 is hermetically sealed by the lid 3. The package 2 has, for example, a package size of 5.0×3.2 mm. The package 2 includes the recess part 2a whose upper part is opened, and the core section 5 is hermetically encapsulated in the recess part 2a. To the upper surface of the peripheral wall part 2b that surrounds the recess part 2a, the lid 3 is fixed by seam welding via the sealant 8. Thus, the inside of the package 2 is hermetically sealed (in the airtight state). As the sealant 8, a metal sealant such as Au-Su alloy or solder is suitably used, however, other sealants including low melting point glass may also be used. However, the present invention is not limited thereto. The sealing may also be performed by seam welding with metal rings, direct seam welding without metal rings, or by beam welding. (However, note that the seam welding is preferred from the viewpoint of prevention of loss of vacuum). The space inside the package 2 is preferably in a vacuum state (for example, with the degree of vacuum not more than 10 Pa) or an atmosphere with low thermal conductivity with low pressure nitrogen or low pressure argon. FIG. 12 shows the OCXO 1 with the lid 3 being removed in order to indicate the internal configuration of the OCXO 1.

The step parts 2c are formed on the inner wall surface of the peripheral wall part 2b of the package 2 so as to be along the arrangement of the connection terminals (not shown). The core section 5 is disposed on the bottom surface of the recess part 2a (on the inner bottom surface of the package 2) between the facing pair of step parts 2c via the plate-like core substrate 4. Alternatively, the step parts 2c may be formed to surround the four sides of the bottom surface of the recess part 2a. The core substrate 4 is made of a resin material having heat resistance and flexibility such as polyimide. The core substrate 4 may be made of crystal.

The core substrate 4 is bonded to the bottom surface of the recess part 2a (i.e. to the inner bottom surface of the package 2) by a non-conductive adhesive 7a. The space 2d is formed under the core substrate 4. Also, the external terminals (not shown) formed on the respective components of the core section 5 are connected to the connection terminals formed on the step surfaces of the step parts 2c by wire bonding via the wires 6a and 6b. On the respective inner sides of the non-conductive adhesives 7a, spacer members 2f are provided.

The non-conductive adhesives 7a are disposed on both end parts of the core substrate 4 in the long-side direction so as to be straight lines extending in the short-side direction of the core substrate 4 (i.e. in the direction orthogonally intersecting with the direction of the sheet on which FIG. 12 is illustrated). Each spacer member 2f is located side by side with the corresponding non-conductive adhesive 7a so as to be a straight line extending in the short-side direction of the core substrate 4. Thus, the respective spacer members 2f are interposed, each inside the corresponding non-conductive adhesive 7a, between the core substrate 4 and the inner bottom surface of the package 2. The both end parts of the core substrate 4 in the long-side direction are supported by the respective spacer members 2f.

The core substrate 4 is made of a resin material having heat resistance and flexibility such as polyimide. The spacer member 2f is made of a paste material such as molybdenum and tungsten. In this way, between the core substrate 4 and the inner bottom surface of the package 2, there are interposed substances such as the non-conductive adhesives 7a and the spacer members 2f. Thus, it is possible to easily ensure the space 2d between the core substrate 4 and the inner bottom surface of the package 2 by the interposed substances. Also, the thickness of the non-conductive adhesive 7a applied onto the inner bottom surface of the package 2 is defined by the spacer member 2f, which also results in easy definition of the width of the space 2d between the core substrate 4 and the inner bottom surface of the package 2. The thickness of the spacer member 2f is preferably 5 to 50 μm.

In the above-described embodiments, the package 2 is a single package. However, the present invention is not limited thereto. It is possible to use, for example, an H-shaped package as shown in FIG. 13, or a stacked configuration of two packages. FIG. 13 is a cross-sectional view illustrating a schematic configuration of the OCXO 1 according to variation 2.

As shown in FIG. 13, the OCXO 1 with the H-shaped package includes the package 2 that has a recess part 2e whose lower part is opened, apart from the recess part 2a whose upper part is opened. In the recess part 2e that is formed in a second main surface that is opposite to a first main surface on which the core section 5 is mounted (i.e. the first main surface in which the recess part 2a is formed), it is possible to dispose a circuit component (for example, a circuit component attached by soldering) such as a chip capacitor 4d as an electronic component for adjustment that is used in combination with the heater IC 52. Unlike the recess part 2a, the recess part 2e where the chip capacitor 4d is disposed is not needed to be sealed by the lid.

Here, the chip capacitor 4d can be disposed in the space where the core section 5 is housed (i.e. in the recess part 2a). However, it is possible to reduce the heat capacity in the space where the core section 5 is housed by providing the circuit component in the space (i.e. in the recess part 2e) other than that where the core section 5 is housed, as shown in FIG. 13. Thus, it is possible to control the temperature with low electric power and furthermore to improve the temperature followability of the core section 5. Also, it is possible to prevent subsequent generation of gas due to soldering or flux in the inner atmosphere of the hermetically sealed recess part 2a. Therefore, the core section 5 is not affected by the gas, which is desirable in order to realize further stabilization of electrical characteristics.

This application claims priority based on Patent Application No. 2020-130421 filed in Japan on Jul. 31, 2020. The entire contents thereof are hereby incorporated in this application by reference.

INDUSTRIAL APPLICABILITY

The present invention is suitably applied to an oven-controlled crystal oscillator including a core section having a piezoelectric resonator, an oscillation IC, and a heater IC.

DESCRIPTION OF REFERENCE NUMERALS

1 Oven-controlled crystal oscillator
2 Package
4 Core substrate
5 Core section
50 Crystal resonator (piezoelectric resonator)
51 Oscillation IC
52 Heater IC
100 Crystal oscillator

The invention claimed is:

1. An oven-controlled crystal oscillator comprising a core section hermetically encapsulated in a package for thermal insulation, wherein
the core section is supported on a lower side thereof by the package via a core substrate, and
the core section has a layered structure in which at least an oscillation IC, a piezoelectric resonator and a heater IC are laminated together in sequence in a thickness direction of the core section from an upper side of the core section toward the lower side.

2. The oven-controlled crystal oscillator according to claim 1, wherein
a thermal conductivity enhancer fixes at least one pair of facing surfaces to each other out of the following pairs: respective facing surfaces of the oscillation IC and the piezoelectric resonator; respective facing surfaces of the piezoelectric resonator and the heater IC; and respective facing surfaces of the heater IC and the core substrate.

3. The oven-controlled crystal oscillator according to claim 2, wherein the oscillation IC, the piezoelectric resonator and the heater IC respectively have areas, in plan view, that become gradually smaller from the lower side to the upper side, one of the oscillation IC and the piezoelectric resonator having a whole facing surface with a smaller area, faces the other of the oscillation IC and the piezoelectric resonator, and one of the piezoelectric resonator and the heater IC having a whole facing surface with a smaller area, faces the other of the piezoelectric resonator and the heater IC.

4. The oven-controlled crystal oscillator according to claim 2, wherein all of a rear surface of the core section faces the core substrate.

5. The oven-controlled crystal oscillator according to claim 1, wherein the core substrate is bonded to the package so as to have a space between the core substrate and an inner bottom surface of the package.

6. The oven-controlled crystal oscillator according to claim 5, wherein a pair of step parts facing each other is formed inside the package, and the core substrate is disposed so as to be bridged between the pair of step parts.

7. The oven-controlled crystal oscillator according to claim 5, wherein an interposed substance is disposed between the core substrate and the inner bottom surface of the package.

8. The oven-controlled crystal oscillator according to claim 1, wherein the piezoelectric resonator includes: a first sealing member and a second sealing member both made of glass or crystal; and a piezoelectric resonator plate made of crystal, the piezoelectric resonator plate has a vibrating part, on respective main surfaces of which excitation electrodes are formed, and the first sealing member and the second sealing member are laminated and bonded to each other via the piezoelectric resonator plate so as to hermetically seal the vibrating part of the piezoelectric resonator plate in an internal space.

9. The oven-controlled crystal oscillator according to claim 8, wherein the piezoelectric resonator plate includes: the vibrating part formed so as to have a substantially rectangular shape; an external frame part surrounding an outer periphery of the vibrating part; and a connecting part connecting the vibrating part to the external frame part, and the oscillation IC is overlapped with at least part of the external frame part of the piezoelectric resonator plate in plan view.

* * * * *